United States Patent
Yeh et al.

(10) Patent No.: US 7,672,144 B2
(45) Date of Patent: Mar. 2, 2010

(54) FASTENING STRUCTURE FOR EXPANSION CARD

(75) Inventors: Yun-Chieh Yeh, Taoyuan County (TW); Wei-Xiao Huang, Taipei (TW); Chang-Ming Kuan, Taipei (TW)

(73) Assignee: Inventec Corporation, Taipei (TW)

( * ) Notice: Subject to any disclaimer, the term of this patent is extended or adjusted under 35 U.S.C. 154(b) by 57 days.

(21) Appl. No.: 12/196,006

(22) Filed: Aug. 21, 2008

(65) Prior Publication Data
US 2010/0014266 A1 Jan. 21, 2010

(30) Foreign Application Priority Data
Jul. 15, 2008 (TW) .............................. 97126797 A

(51) Int. Cl.
*H05K 7/12* (2006.01)
(52) U.S. Cl. .................. 361/801; 361/759; 361/747; 361/732; 312/223.2
(58) Field of Classification Search ................. 361/726, 361/732, 740, 747, 759, 801; 312/223.2, 312/223.3
See application file for complete search history.

(56) References Cited

U.S. PATENT DOCUMENTS

| 6,693,800 | B1* | 2/2004 | Lin et al. | 361/759 |
| 6,834,766 | B2* | 12/2004 | Lin et al. | 211/41.17 |
| 7,002,811 | B2* | 2/2006 | Jing et al. | 361/801 |
| 7,130,200 | B1* | 10/2006 | Liu | 361/801 |
| 7,486,527 | B1* | 2/2009 | Yang | 361/801 |

* cited by examiner

*Primary Examiner*—Dameon E Levi
(74) *Attorney, Agent, or Firm*—J.C. Patents

(57) ABSTRACT

A fastening structure for an expansion card is provided. The card has a baffle and one end of the baffle is formed with a bending portion and a first long hole. The fastening structure includes a flat plate located at one side of a case and has a plane extending toward inside the case; a first supporting portion and a second supporting portion fastened at the plane of the flat plate; a fastening member having a pressing portion and at least one second long hole. The fastening member is disposed at the first supporting portion via the second long hole, and slidably leans against the plane. The pressing portion extends toward the bending portion. When the fastening member slides to a fixing position, the pressing portion presses the bending portion, and the baffle is fastened at the second supporting portion via the first long hole and leans against the plane.

6 Claims, 6 Drawing Sheets

FASTENING STRUCTURE FOR EXPANSION CARD

CROSS-REFERENCE TO RELATED APPLICATION

This application claims the priority benefit of Taiwan application serial no. 97126797, filed on Jul. 15, 2008. The entirety of the above-mentioned patent application is hereby incorporated by reference herein and made a part of specification.

BACKGROUND OF THE INVENTION

1. Field of the Invention

The present invention relates to a fastening structure, and more particularly to a fastening structure for an expansion card.

2. Description of Related Art

In order to expand the functions of personal computers, servers, notebook computers, and the like, expansion cards can be connected via expansion slots of the computers. For example, display cards, network cards, sound cards, memory cards, or television cards are connected via PCI slots or PCI-E slots.

In the past, in order to fasten an expansion card into a case of a computer, after an expansion card 10 is inserted into an expansion slot ST, a screw 122 is required to pass through a bending portion 12a of a baffle 12 and to be threaded into a screw hole 120h of a bracket 120, as shown in FIG. 1. In this case, a securing tool is needed and the screw may be lost after being screwed off. A tooless fastening structure for an expansion card becomes another development solution.

However, in all such fastening structures, a back plate 140 of the case is required to be additionally provided with the bracket 120. As a result, the manufacturing cost of the case is increased. What's worse, the bracket has a concave shape toward inside the case, and thus the case cannot be made flat and the appearance thereof is also affected.

SUMMARY OF THE INVENTION

Accordingly, the present invention is directed to a fastening structure for an expansion card, which is suitable for fastening the expansion card without a securing tool, so as to reduce the manufacturing cost of a case and improve the appearance of the case.

As embodied and broadly described herein, a fastening structure for an expansion card is provided in the present invention, adapted to fasten at least one expansion card into a case. The expansion card has a baffle and one end of the baffle is formed with a bending portion and a first long hole. The fastening structure for the expansion card includes a flat plate, a first supporting portion, a second supporting portion, and a fastening member. The flat plate is located at one side of the case as a part of the case and has a plane extending toward inside the case. The first supporting portion and the second supporting portion are respectively fastened at the plane of the flat plate. The fastening member has a pressing portion and at least one second long hole. The fastening member is disposed at the first supporting portion via the second long hole, and slidably leans against the plane. The pressing portion extends toward the bending portion. When the fastening member slides to a fixing position, the pressing portion presses the bending portion, and the baffle is fastened at the second supporting portion via the first long hole and leans against the plane.

In an embodiment of the present invention, the above first supporting portion includes a plurality of first protrusions. The fastening member is mounted at the first protrusions via the second long holes.

In an embodiment of the present invention, the above second supporting portion includes at least one second protrusion. One end of the first long hole of the baffle is formed with a large-aperture portion. The baffle is mounted at the second protrusion via the large-aperture portion.

In an embodiment of the present invention, the above pressing portion includes a plurality of bumps. The bumps respectively press against the bending portion of each expansion card.

In an embodiment of the present invention, the above fastening structure for the expansion card further includes a stopping member slidably arranged at the plane. The stopping member is close to one side of the fastening member and restricts the fastening member from leaving a fixing position.

In an embodiment of the present invention, a moving direction of the above stopping member is perpendicular to that of the fastening member.

With the fastening structure for the expansion card of the present invention, since the expansion card can simply be fastened at the second supporting portion on the flat plate merely by sliding the fastening member on the flat plate, no screws or brackets are needed for fastening the expansion card. Therefore, the expansion card can be fastened without a securing tool, the manufacturing cost of the case is reduced, and the appearance of the case is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
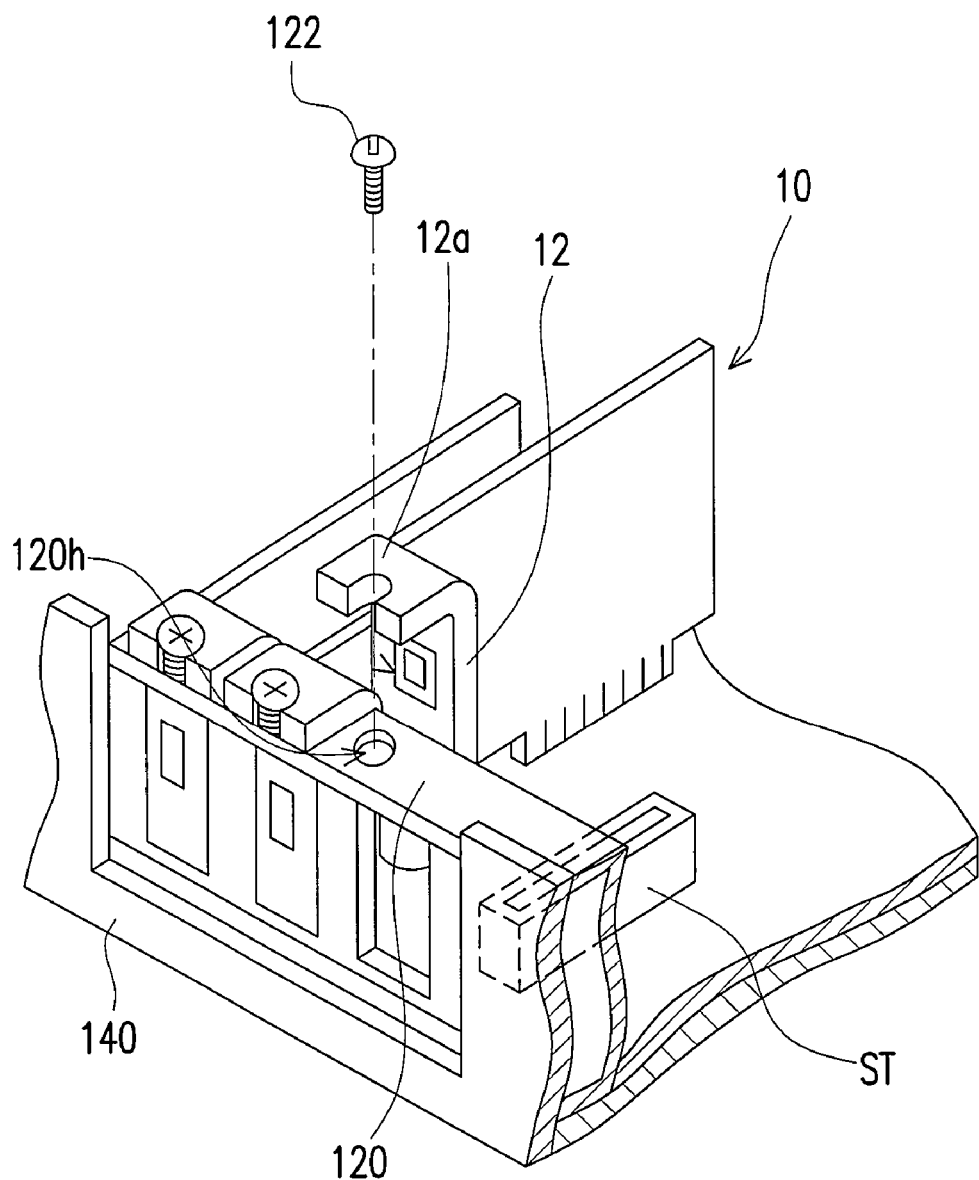
FIG. 1 is a schematic view of a conventional fastening structure for an expansion card.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2:
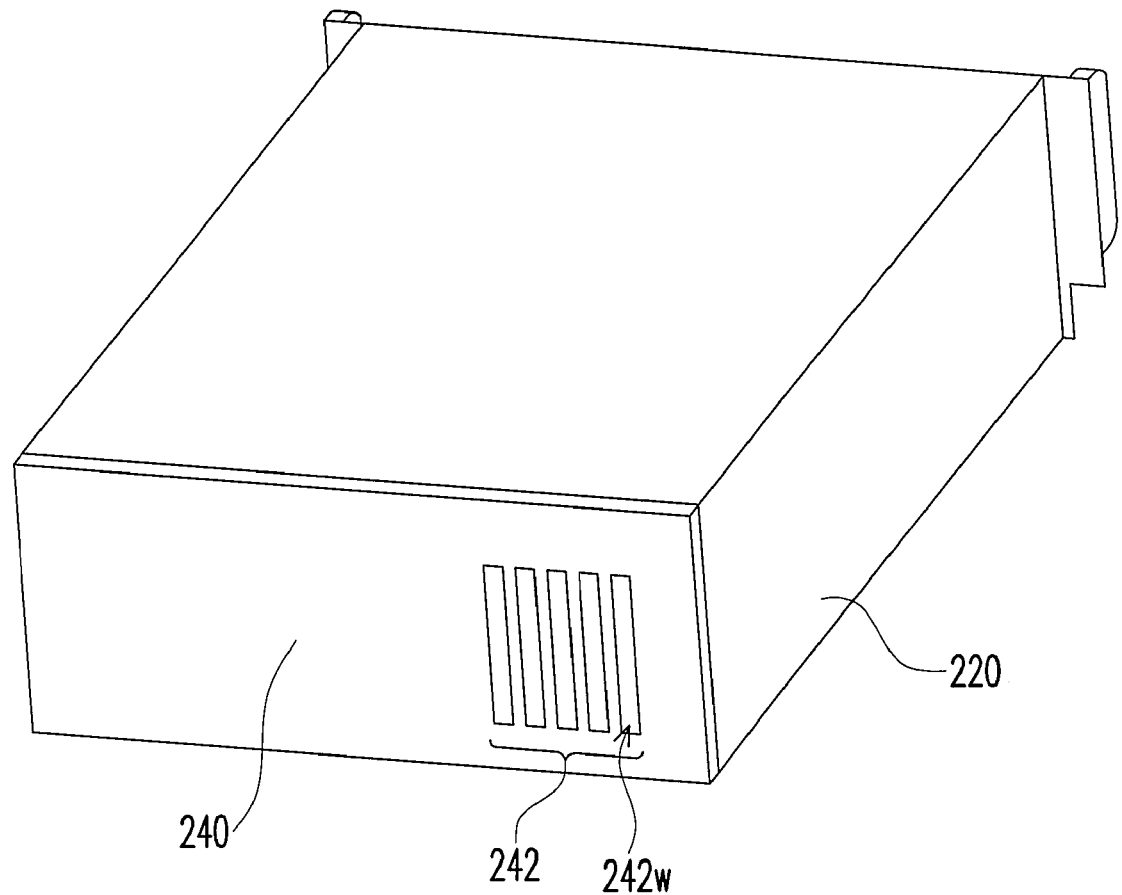
FIG. 2 is a schematic view of a case according to a first embodiment of the present invention.
Figure 3A:
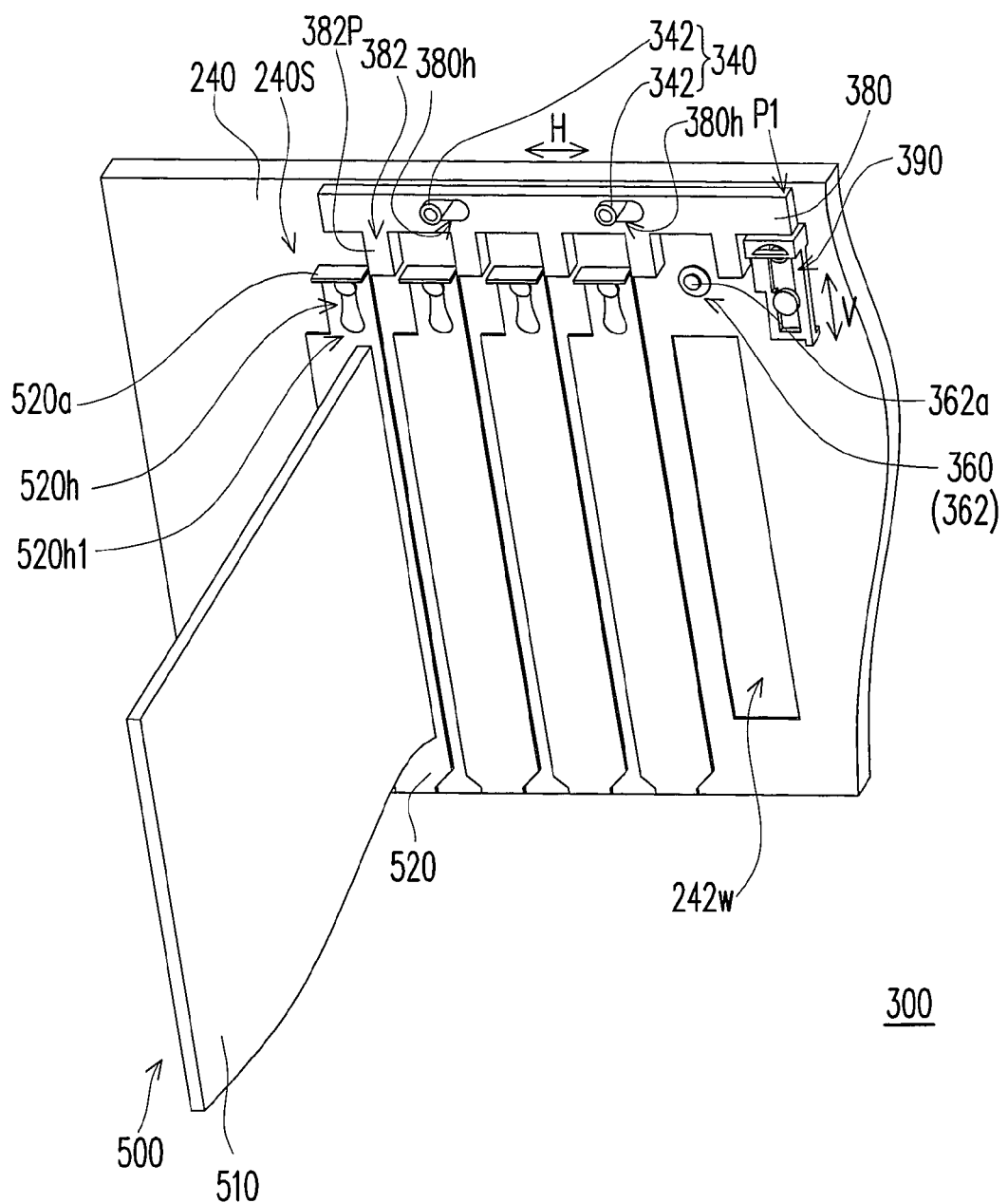
FIGS. 3A and 3B are schematic views of a fastening structure for an expansion card according to the first embodiment of the present invention.
Figure 3B:
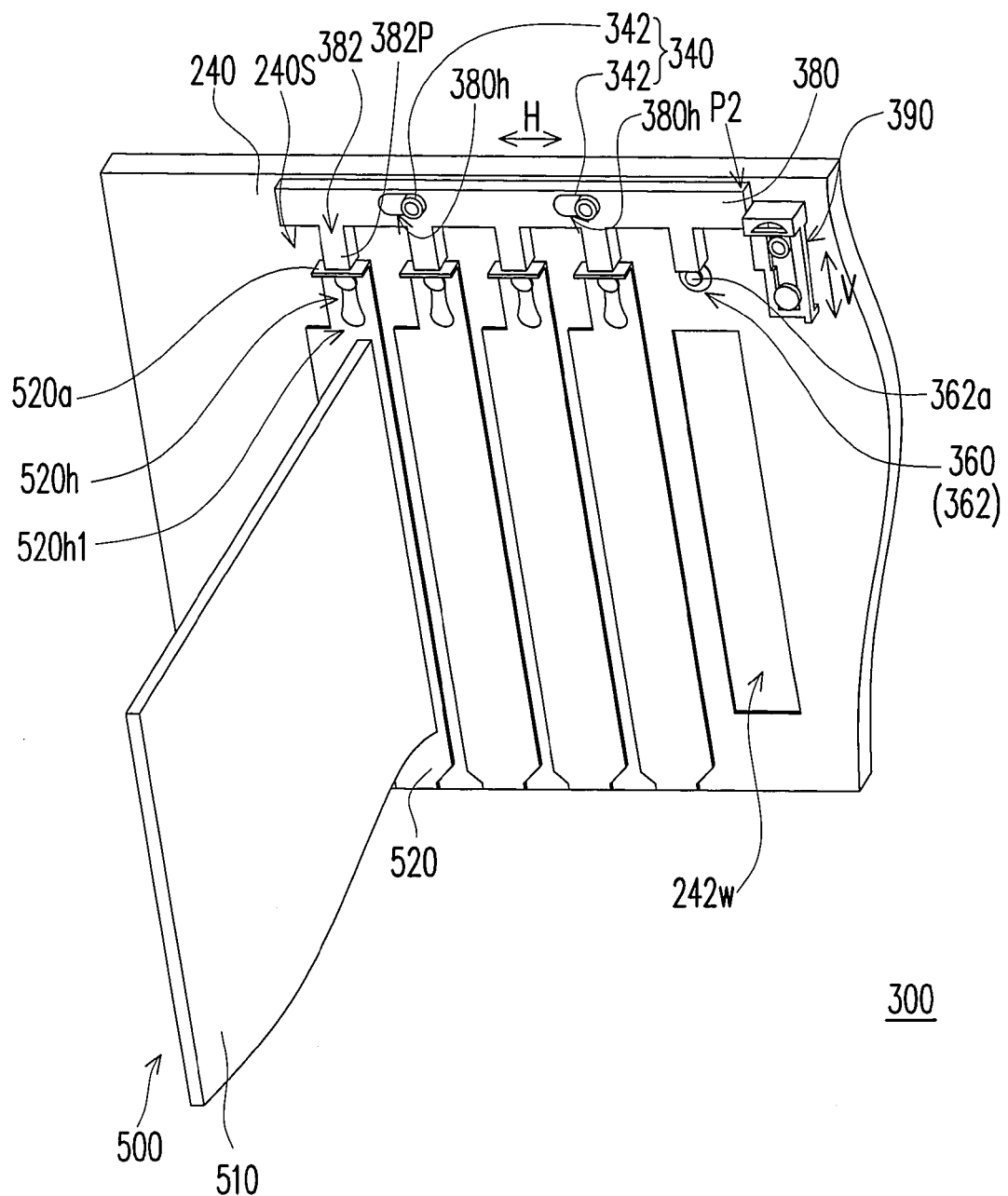

FIG. 2 is a schematic view of a case according to a first embodiment of the present invention. FIGS. 3A and 3B are schematic views of a fastening structure for an expansion card according to the first embodiment of the present invention, in which FIG. 3A shows a fastening member located in a release position (P1), and FIG. 3B shows the fastening member sliding to a fixing position (P2).

Referring to FIG. 2, the fastening structure for the expansion card according to the first embodiment of the present invention is adapted to fasten at least one expansion card 500 (shown in FIG. 3A) into a case 200. The case 200 includes an upper cover 220 and a flat plate 240 located at one side of the upper cover 220. The flat plate 240 can serve as a back plate of the case 200 in this embodiment. The flat plate 240 has an effect of improving the appearance of the case 200 and makes the case 200 become neat and flat. An interface portion 242 of the flat plate 240 is formed with a plurality of openings 242w, so as to expose a connection port (not shown) of the expansion card 500.

Referring to FIG. 3A, the expansion card 500 has a card body 510 and a baffle 520. An upper end of the baffle 520 is formed with a bending portion 520a and a first long hole 520h. The fastening structure 300 for the expansion card according to the first embodiment of the present invention includes the flat plate 240, a first supporting portion 340, a second supporting portion 360, and a fastening member 380. The flat plate 240 has a plane 240S extending toward inside the case 200. The first supporting portion 340 is fastened at the plane 240S of the flat plate 240 for supporting the fastening member 380. In addition, the second supporting portion 360 is also fastened at the plane 240S for supporting the baffle 520.

Moreover, the above fastening member 380 has a pressing portion 382 and at least one (herein, two) second long hole 380h. The fastening member 380 is disposed at the above first supporting portion 340 via the second long holes 380h, and slidably (herein, sliding along a horizontal direction H) leans against the plane 240S. The pressing portion 382 extends toward the bending portion 520a, so as to press the bending portion 520a.

Then, it is further illustrated below about how to fasten an expansion card 500 by the fastening structure 300 for the expansion card. Referring to FIG. 3A, the fastening member 380 is slid to the release position P1 first. Then, the expansion card 500 is inserted into an expansion slot (not shown), and the baffle 520 of the expansion card 500 is mounted at the second supporting portion 360 via the first long hole 520h. Then, referring to FIG. 3B, the fastening member 380 is slid to the fixing position P2. At this point, the pressing portion 382 presses a bending portion 520a of the baffle 520 and meanwhile the baffle 520 is fastened at the second supporting portion 360 via the first long hole 520h and leans against the plane 240S. In this manner, the expansion card 500 is fastened on the flat plate 240 of the case 200 via the fastening member 380 and the second supporting portion 360.

With the fastening structure for the expansion card of the present invention, since the fastening motion can be achieved simply by sliding the fastening member of the case, no additional securing tool is needed. Moreover, since the supporting motion can be achieved without brackets, the manufacturing cost of the case is reduced, and the case is made flat, thereby improving the appearance of the case.

Referring to FIG. 3B, on one aspect, the above first supporting portion 340 is, for example, a plurality of (herein, two) first protrusions 342. The fastening member 380 is mounted at the first protrusions 342 via the second long holes 380h. On the other aspect, the second supporting portion 360 is, for example, a second protrusion 362. A lower end of the first long hole 520h of the baffle 520 is formed with a large-aperture portion 520h1. The second protrusion 362 includes, for example, a head portion 362a and a rod portion (not shown). A diameter of the head portion 362a is smaller than that of the large-aperture portion 520h1 and larger than a width of the first long hole 520h. Therefore, the baffle 520 can be hung at the rod portion by means of the large-aperture portion 520h1 passing through the head portion 362a. When the pressing portion 382 presses the bending portion 520a, an upper end of the first long hole 520h of the baffle 520 leans against the rod portion.

The pressing portion 382 is, for example, a plurality of (herein, five) bumps 382P. The bumps 382P are adapted to respectively press against the bending portion 520a of each expansion card 500 in the fixing position P2. In this manner, a user can quickly and easily fasten a plurality of expansion cards 500 into the case. The bumps 382P are, for example, arranged in a lateral direction and spaced apart from each other at an equal pitch. The pitch is not necessarily a constant width, but any distance may be set, as long as it is sufficient for the baffle 520 to move up and down freely. Therefore, when the baffle 520 is installed or removed, the baffle 520 and the bumps 382P do not interfere with each other in terms of the structure.

In order to stably maintain the fastening member 380 in the fixing position P2, the fastening structure 300 for the expansion card of the present invention is additionally provided with a stopping member 390. Referring to FIG. 3A, the stopping member 390 is slidably (herein, sliding along a vertical direction V) arranged at the plane 240S. The stopping member 390 is close to one side (for example, the right side) of the fastening member 380. A moving direction (herein, the vertical direction V) of the stopping member 390 is perpendicular to that (herein, the horizontal direction H) of the fastening member 380. In this embodiment, when it is intended to fasten the expansion card 500, the stopping member 390 is slid downward first, then, the fastening member 380 is slid to the release position P1, and then the expansion card 500 is inserted into a slot, and the baffle 520 is mounted at the second protrusion 362, as shown in FIG. 3A. Then, the fastening member 380 is slid to the fixing position P2, and then the stopping member 390 is slid upward, so as to restrict the fastening member 380 from leaving the fixing position P2, as shown in FIG. 3B.

Second Embodiment

Figure 4A:
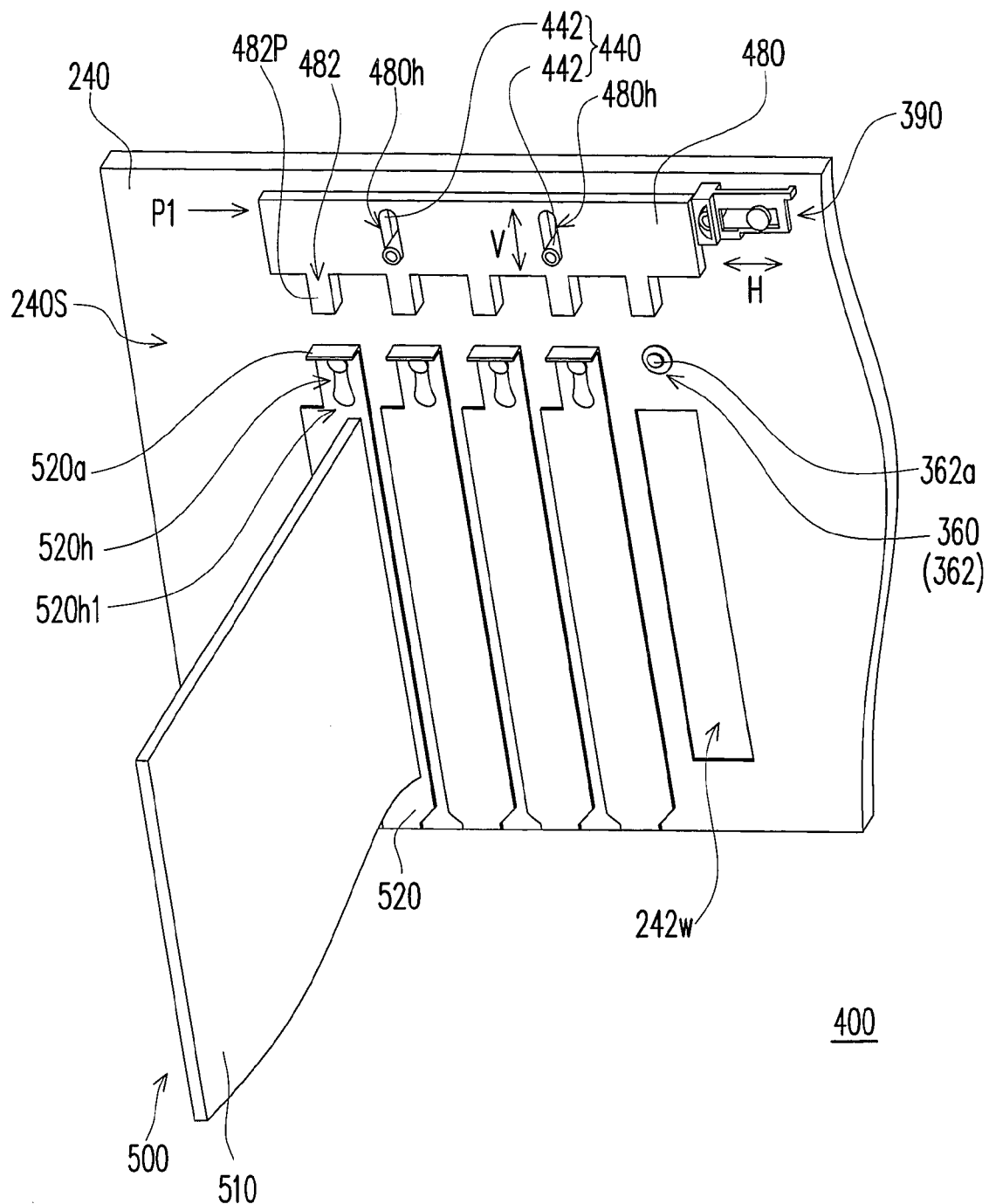
FIGS. 4A and 4B are schematic views of a fastening structure for an expansion card according to a second embodiment of the present invention.
Figure 4B:
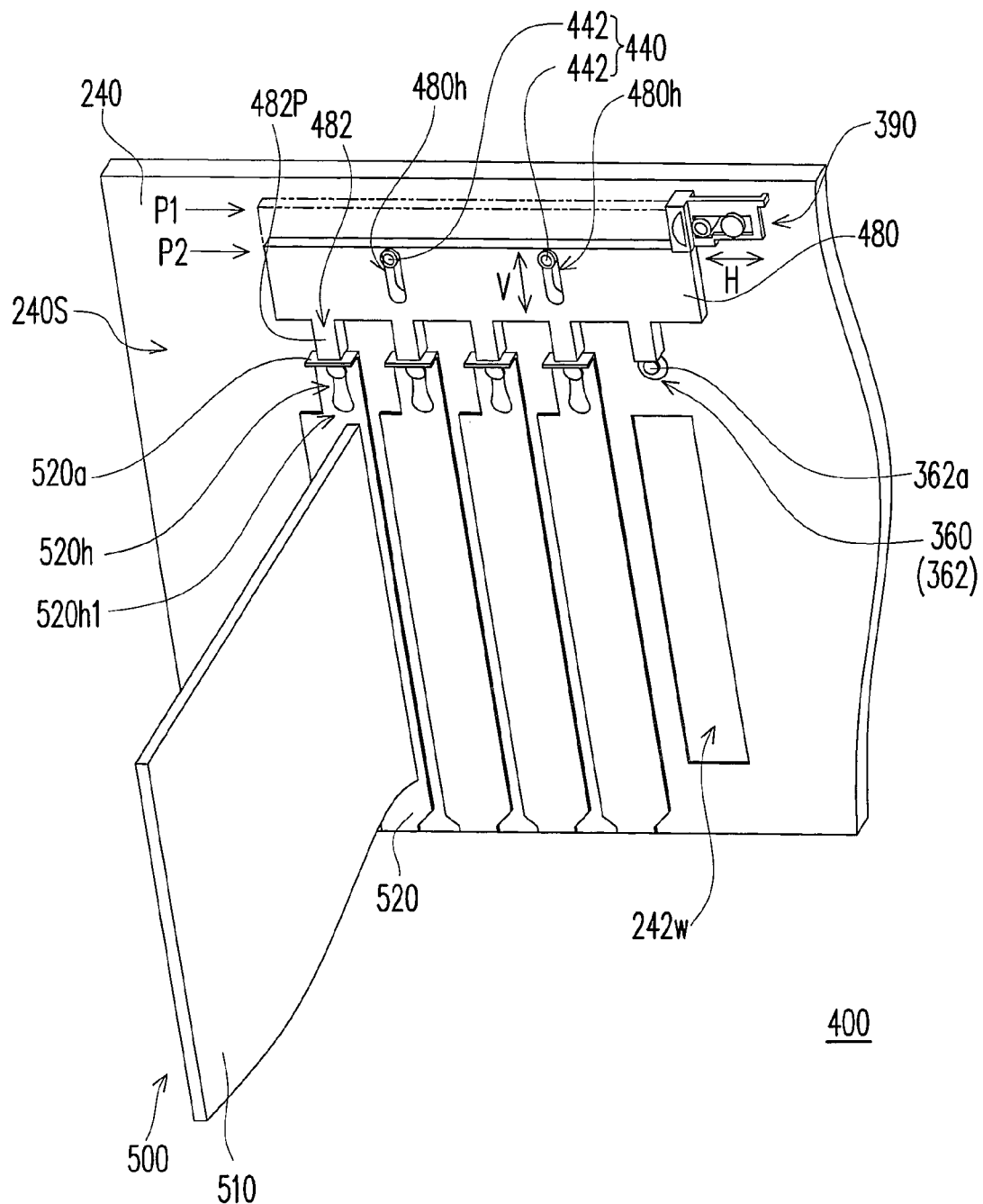

FIGS. 4A and 4B are schematic views of a fastening structure for an expansion card according to a second embodiment of the present invention, in which FIG. 4A shows a fastening member located in a release position (P1), and FIG. 4B shows the fastening member sliding to a fixing position (P2). The same reference numerals represent the same elements, and illustrations of the same elements are omitted.

Compared with the first embodiment, the main differences there-between lie in a sliding direction of a fastening member and a disposed position and a sliding direction of a stopping member. A fastening member 480 of the fastening structure 400 for the expansion card in this embodiment includes a pressing portion 482 and two second long holes 480h extending vertically. The fastening member 480 is disposed at a first supporting portion 440 via the second long holes 480h, and slidably (herein, sliding along the vertical direction V) leans against the plane 240S. The pressing portion 482 extends toward a bending portion 520a. Since the fastening member 480 in this embodiment can slide vertically, the pressing portion 482 simultaneously presses a plurality of baffles 520 (it is unnecessary for the pressing portion 482 to be formed with a plurality of bumps 482P), thereby quickly fastening a plurality of expansion cards 500.

Then, it is illustrated below about how to fasten the expansion card 500 by the fastening structure 400 for the expansion card in this embodiment. In this embodiment, when it intends to fasten the expansion card 500, the stopping member 390 (herein, slidable along the horizontal direction H) is slid rightward, then, the fastening member 480 is slid upward to a release position P1, and then the expansion card 500 is inserted into a slot and meanwhile the baffle 520 is mounted at the second supporting portion 360, as shown in FIG. 4A. Then, the fastening member 480 is slid to the fixing position P2, and then the stopping member 390 is slid leftward, so as to restrict the fastening member 480 from leaving the fixing position P2, as shown in FIG. 4B.

To sum up, with the fastening structure for the expansion card of the present invention, since the expansion card can simply be fastened at the second supporting portion on the flat plate merely by sliding the fastening member on the flat plate, no screws or brackets are needed for fastening the expansion card. Therefore, an expansion card can be fastened without an additional securing tool, the manufacturing cost of the case can be reduced, and the appearance of the case is made desirable and flat. Moreover, the user can quickly and easily fasten a plurality of expansion cards into the case.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fastening structure for an expansion card, adapted to fasten at least one expansion card into a case, wherein the expansion card comprises a baffle and one end of the baffle is formed with a bending portion and a first long hole, the fastening structure for the expansion card comprising:
    a flat plate, located at one side of the case as a part of the case, and formed with a plane extending toward inside the case;
    a first supporting portion and a second supporting portion, respectively fastened at the plane of the flat plate; and
    a fastening member, comprising a pressing portion and at least one second long hole, wherein the fastening member is disposed at the first supporting portion via the second long hole, and slidably leans against the plane, and the pressing portion extends toward the bending portion;
    wherein when the fastening member slides to a fixing position, the pressing portion presses the bending portion and the baffle is fastened at the second supporting portion via the first long hole and leans against the plane.

2. The fastening structure for an expansion card according to claim 1, wherein the first supporting portion comprises a plurality of first protrusions, and the fastening member is mounted at the first protrusions via the second long holes.

3. The fastening structure for an expansion card according to claim 1, wherein the second supporting portion comprises at least one second protrusion, one end of the first long hole of the baffle is formed with a large-aperture portion, and the baffle is mounted at the second protrusion via the large-aperture portion.

4. The fastening structure for an expansion card according to claim 1, wherein the pressing portion comprises a plurality of bumps respectively pressing against the bending portion of each expansion card.

5. The fastening structure for an expansion card according to claim 1, further comprising a stopping member slidably arranged at the plane, wherein the stopping member is close to one side of the fastening member and restricts the fastening member from leaving a fixing position.

6. The fastening structure for an expansion card according to claim 5, wherein a moving direction of the stopping member is perpendicular to that of the fastening member.

* * * * *